(12) United States Patent
Boehm et al.

(10) Patent No.: US 12,466,996 B2
(45) Date of Patent: Nov. 11, 2025

(54) μLED CHIP ARCHITECTURE BASED ON NANOSTRUCTURED PEROVSKITE CONVERTER MATERIALS

(71) Applicant: OSRAM OLED GmbH, Regensburg (DE)

(72) Inventors: Marcus Boehm, Thalmassing (DE); Britta Goeoetz, Regensburg (DE); Martin Strassburg, Donaustauf (DE)

(73) Assignee: OSRAM OLED GmbH, Regensburg (DE)

( * ) Notice: Subject to any disclaimer, the term of this patent is extended or adjusted under 35 U.S.C. 154(b) by 757 days.

(21) Appl. No.: 17/262,106

(22) PCT Filed: Jul. 24, 2019

(86) PCT No.: PCT/EP2019/069874
§ 371 (c)(1),
(2) Date: Jan. 21, 2021

(87) PCT Pub. No.: WO2020/020925
PCT Pub. Date: Jan. 30, 2020

(65) Prior Publication Data
US 2021/0261860 A1      Aug. 26, 2021

(30) Foreign Application Priority Data

Jul. 25, 2018   (DE) .......................... 102018117992.8
Oct. 16, 2018   (DE) .......................... 102018125646.9

(51) Int. Cl.
*C09K 11/66*       (2006.01)
*B82Y 20/00*       (2011.01)
(Continued)

(52) U.S. Cl.
CPC ............ *C09K 11/665* (2013.01); *C09K 11/02* (2013.01); *H10H 20/8512* (2025.01);
(Continued)

(58) Field of Classification Search
CPC ..... C09K 11/665; C09K 11/02; H01L 33/502; H01L 2933/0041; B82Y 20/00; B82Y 40/00; B82Y 30/00
See application file for complete search history.

(56) References Cited

U.S. PATENT DOCUMENTS 10,886,145 B2 *   1/2021   Zitzlsperger ........ H01L 33/0095
10,937,825 B2 *   3/2021   Burger ..................... G02B 3/08
(Continued)

FOREIGN PATENT DOCUMENTS

WO   WO-2015099412 A1 *   7/2015   ........... C01G 21/006
WO   2018064235 A1        4/2018

OTHER PUBLICATIONS

Perovskite (structure)—Wikipedia (Year: 1998).*
(Continued)

*Primary Examiner* — Kretelia Graham
*Assistant Examiner* — Jaesun Lee
(74) *Attorney, Agent, or Firm* — Slater Matsil, LLP

(57) ABSTRACT

A method for producing an optoelectronic semiconductor component and an optoelectronic component are disclosed. In an embodiment a method includes providing an optoelectronic semiconductor chip comprising at least one light-emitting layer and at least one cavity and introducing at least one precursor of a conversion element in the at least one cavity, wherein the at least one conversion element comprises a perovskite-based $ABX_3$ or $A_2BB'X_6$ structure.

13 Claims, 7 Drawing Sheets

(51) Int. Cl.
| | |
|---|---|
| *B82Y 40/00* | (2011.01) |
| *C09K 11/02* | (2006.01) |
| *H01L 33/50* | (2010.01) |
| *H10H 20/851* | (2025.01) |
| *H10H 20/01* | (2025.01) |

(52) U.S. Cl.
CPC ............... *B82Y 20/00* (2013.01); *B82Y 40/00* (2013.01); *H10H 20/0361* (2025.01)

(56) References Cited

U.S. PATENT DOCUMENTS

| | | | |
|---|---|---|---|
| 11,004,834 B2* | 5/2021 | Ghasemi Afshar ... | H01L 27/153 |
| 2017/0155020 A1* | 6/2017 | Lin .................... | H01L 33/60 |
| 2017/0194101 A1* | 7/2017 | Karunadasa ............ | C07F 7/24 |

OTHER PUBLICATIONS

Horng et al., "Development and Fabrication of AlGaInP-Based Flip-Chip Micro-LEDs", Journal of Electron Devices Society, vol. 6, 475 (2018) (Year: 2018).*

Chen, Z. et al., "High-Performance Color-Tunable Perovskite Light Emitting Devices through Structural Modulation from Bulk to Layered Film," Advanced Science News, Advanced Materials, Dec. 21, 2016, 8 pages.

Palazon, F. et al., "Polymer-Free Films of Inorganic Halide Perovskite Nanocrystals as UV-to-White Color-Conversion Layers in LEDs," Chemistry of Materials, Apr. 19, 2016, 5 pages.

Loiudice, A. et al., "CsPbBr3 QD/AlOx Inorganic Nanocomposites with Exceptional Stability in Water, Light, and Heat," GDCh, Quantum Dots, Wiley Online Library, May 26, 2017, 6 pages.

Mao, J. et al., "Novel Direct Nanopatterning Approach to Fabricate Periodically Nanostructured Perovskite for Optoelectronic Applications," Advanced Functional Materials, Advanced Science News, Jan. 24, 2017, 10 pages.

Niu, X. et al., "Characterizing and Patterning of PDMS-Based Conducting Composites," Advanced Materials, vol. 19, Aug. 21, 2007, 5 pages.

Protesescu, L. et al., "Nanocrystals of Cesium Lead Halide Perovskites (CsPbX3, X=Cl, Br, and I): Novel Optoelectronic Materials Showing Bright Emission with Wide Color Gamut," ACS Publications, NANO Letters, American Chemical Society, Jan. 29, 2015, 5 pages.

Richter, J. et al., "Enhancing photoluminescence yields in lead halide perovskites by photon recycling and light out-coupling," Nature Communications, Dec. 23, 2016, 8 pages.

Sichert, J. et al., "Quantum Size Effect in Organometal Halide Perovskite Nanoplatelets," NANO Letters, ACS Publications, 2015 American Chemical Society, Sep. 1, 2015, 7 pages.

Wang, D. et al., "Polarized emission from CsPbX3 perovskite quantum dots," Nanoscale, 8, 11565, May 5, 2016, 6 pages.

* cited by examiner

μLED CHIP ARCHITECTURE BASED ON NANOSTRUCTURED PEROVSKITE CONVERTER MATERIALS

This patent application is a national phase filing under section 371 of PCT/EP2019/069874, filed Jul. 24, 2019, which claims the priority of German patent application 102018125646.9, filed Oct. 16, 2018, which claims the priority of German patent application 102018117992.8, filed Jul. 25, 2018, each of which is incorporated herein by reference in its entirety.

TECHNICAL FIELD

A method for producing an optoelectronic semiconductor component, an optoelectronic semiconductor component and a use of an optoelectronic semiconductor component are specified.

BACKGROUND

Perovskite-based materials for generation of green and red light are based on the structural formula $ABX_3$ or $A_2BB'X_6$ where an inorganic cation (usually cesium or potassium or an organic molecule such as methylammonium or formamidinium) occupies position A. For optical applications in the visible and near IR region, lead or tin is used in position B, or both silver and bismuth or bismuth only at positions B and B', and the anionic component used at position X is halides such as chlorides, bromides or iodides.

For adjustment of the absorption and emission spectrum of the perovskite converter material in the green/red spectral region, the anionic component is varied between chlorides (blue/green spectral region), bromides (green spectral region), iodides (red/infrared spectral region) or mixtures of these.

SUMMARY

Embodiments provide an optoelectronic semiconductor component comprising, for example, multiple μLED chips, which has a microstructure and emits white light with a widely adjustable color temperature. What is meant by μLED chip in the context of this disclosure is a LED chip architecture, the dimensions of which do not exceed an edge length of 150 μm. Further embodiments provide a method for producing an optoelectronic semiconductor component, and for the use of an optoelectronic semiconductor component.

Embodiments provide a method for producing an optoelectronic semiconductor component, comprising:
providing an optoelectronic semiconductor chip comprising:
at least one light-emitting layer,
at least one cavity, and
introducing at least one precursor of a conversion element,
wherein the at least one conversion element comprises a perovskite-based $ABX_3$ or $A_2BB'X_6$ structure.

What is meant by an optoelectronic semiconductor component in the context of the disclosure is, for example, an LED (light-emitting diode) component, especially a component having at least one μLED chip.

What is meant by an optoelectronic semiconductor chip in the context of the disclosure is an electrically contactable element that can be handled separately. A semiconductor chip is especially the result of individualization from a wafer composite.

According to embodiments, the optoelectronic semiconductor chip comprises at least one light-emitting layer. This may comprise, for example, indium-doped gallium nitride.

The optoelectronic semiconductor chip also comprises at least one cavity. The cavity may also be referred to as a well or recess. The cavity preferably comprises the light-emitting layer as base and a dividing wall or multiple dividing walls as lateral parts. More preferably, a cavity in the context of the disclosure does not have a top layer by which it would be fully sealed off, but should be regarded as an open structure.

In one embodiment, the dividing wall(s) adjoin(s) the at least one light-emitting layer and form a 90° angle therewith. In an alternative embodiment, the dividing walls may be arranged at an about 90° angle on the light-emitting layer. A further embodiment comprises an arrangement in which the dividing walls are each at an angle of 120° to one another.

The dividing walls are preferably reflective. The material of the reflective dividing walls may be epoxide or silicone provided with reflective particles, such as titanium dioxide, and/or metal particles, such as silver, aluminum or gold, and/or barium titanium dioxide particles, for example $BaTiO_3$, and/or yttrium boron oxide particles, such as $YBO_3$, and/or alkaline earth metal carboxide particles, such as $CaCO_3$ or $MgCO_3$, and/or ZnS and/or ZnO and/or $ZrO_2$ and/or $BaSO_4$. In addition, the dividing walls may comprise at least one of the following materials: Ni, Al, Au, Si, Ag.

The dividing walls may additionally or alternatively also be absorbing, especially highly absorbing.

The material of the absorbing dividing walls may be carbon-based materials.

The dividing walls may have a length of about 3 μm to about 30 μm, preferably of about 4 μm to about 15 μm, more preferably of about 5 μm to about 10 μm.

The dividing walls may have a height of about 0.5 μm to about 5 μm, preferably of 1 μm to about 2 μm.

The dividing walls may have a thickness of about 1 μm to about 10 μm, preferably of 1 μm to about 2 μm.

If more than one cavity is present, the effect of the dividing walls is preferably optical separation of the individual cavities.

At least one precursor of a conversion element is introduced into the at least one cavity, where the at least one conversion element comprises a perovskite-based $ABX_3$ or $A_2BB'X_6$ structure.

The dimensions of the at least one cavity depend here upon factors including the dimensions of the dividing walls. A cavity preferably has a base area of at least 1 μm×1 μm.

The dividing walls can also form a kind of lattice structure that defines the cavity/cavities. More particularly, more than two dividing walls are needed for a lattice structure. This can also increase the number of cavities.

The dividing walls are preferably formed such that they prevent liquid conversion material from flowing away into the cavities formed by the dividing walls. The dividing walls act here like a kind of barrier.

The base area of the optoelectronic semiconductor chip formed by the multiple cavities and the lattice structure is especially in the range from about 1 $mm^2$ to about 5 $mm^2$, preferably in the range from about 1 $mm^2$ to about 3 $mm^2$, more preferably from about 1 $mm^2$ to about 2 $mm^2$.

The dividing walls, for example for a lattice structure, may be produced by microscale printing techniques, for example a lithography method, or by electrochemical methods. For example, in one embodiment for the application of the dividing walls, it is possible to use a structured photoresist mask. The photoresist mask may be configured such that the photoresist mask has trenches in the region in which the dividing walls are to be formed. The dividing walls then form within the trenches.

In one embodiment, the dividing walls are formed from a photoresist that can be produced by means of a lithography method, for example.

In one embodiment, the at least one dividing wall may also be applied electrochemically.

In a further embodiment, the at least one dividing wall may also be produced by means of a deposited polydimethylsiloxane lattice structure. In order to increase reflectivity at the dividing walls, silver platelets, for example, may be added to the polydimethylsiloxane as additive during the curing. The cured polydimethylsiloxane template can then be applied to a light-emitting layer.

In a further embodiment, the dividing walls may be introduced into the interstices of already positioned blue light-emitting chips. Thus, the base area of the optoelectronic semiconductor chip corresponds to the base area of the cavity, and permits the realization of a μLED chip-based LED architecture that emits red, green and blue light via full conversion if two out of three cavities in each case are filled with green and red perovskite converter material.

The at least one conversion element has a perovskite-based $ABX_3$ or $A_2BB'X_6$ structure. Illustrative perovskite-based $ABX_3$ or $A_2BB'X_6$ structures are: $(K_{0.2}Cs_{0.8})PbBr_3$, $CsPbCl_3$, $CsPbBr_3$ $CsPbI_3$, $CsSnCl_3$, $CsSnBr_3$ $CsSnI_3$, $Cs_2BiAgCl_6$, $Cs_2BiAgBr_6$ or $Cs_2BiAgI_6$.

In one embodiment in the context of the disclosure, in the perovskite-based $ABX_3$ or $A_2BB'X_6$ structure, in general, the variable A represents at least one cation selected from the group consisting of methylammonium, formamidinium, $K^+$, $Rb^+$ and $Cs^+$, X represents an anion selected from the group consisting of $F^-$, $Cl^-$, $Br^-$ and $I^-$, and B represents a cation selected from the group consisting of $Pb^{2+}$, $Sn^{2+}$, $Ge^{2+}$. In structural formula $A_2BB'X_6$, positions B and B' may be occupied in each case, for example, by $Ag^+$ and $Bi^{3+}$ or $Bi^+$ and $Bi^{3+}$.

In one embodiment, the introducing of a precursor of the at least one conversion element comprises the steps of:
introducing a solution of AX into the at least one cavity,
introducing a solution comprising $BX_2$ in the case of an $ABX_3$ structure or BX and $B'X_3$ in the case of an $A_2BB'X_6$ structure into the at least one cavity,
where A is at least one cation selected from the group consisting of methylammonium, formamidinium, $K^+$, $Rb^+$ and $Cs^+$; X is selected from the group consisting of $F^-$, $Cl^-$, $Br^-$ and $I^-$; B is a cation selected from the group consisting of $Pb^{2+}$, $Sn^{2+}$ and $Ge^{2+}$.

If the step of introducing a solution of BX and $B'X_3$ into the at least one cavity is included, B is preferably $Ag^+$ or $Bi^+$ and B' is $Bi^{3+}$. In such an embodiment, it is first possible to prepare a solution of BX and then to combine it with a solution of $B'X_3$.

A method comprising such a step may also be referred to as an "in situ" method for preparing a perovskite-based $ABX_3$ or $A_2BB'X_6$ structure.

A solution of AX can be introduced into the at least one cavity with a micropipette. For this purpose, by way of example, a solution of AX is prepared in an organic solvent, preferably an aprotic solvent, such as dimethylformamide or dimethyl sulfoxide. AX is introduced here into the cavity from preferably saturated solution.

A solution of $BX_2$ or BX and $B'X_3$ can be introduced into the at least one cavity with a micropipette. For this purpose, by way of example, a solution of $BX_2$ or BX and $B'X_3$ is prepared in an organic solvent, preferably an aprotic solvent, such as dimethylformamide or dimethyl sulfoxide. Advantageously, the solution of $BX_2$ or BX and $B'X_3$ has the same solvent as the solution of AX. $BX_2$ or BX and $B'X_3$ is introduced here into the cavity from preferably saturated solution.

In one embodiment, a solution of AX is first introduced into the cavity, and then a solution of $BX_2$ or BX and $B'X_3$.

In a further embodiment, a solution of $BX_2$ or BX and $B'X_3$ is first introduced into the cavity, and then a solution of AX.

Preference is given to introducing an amount of a solution of AX and an amount of a solution of $BX_2$ or BX and $B'X_3$, such that the cavity is filled in such a way that no solution can escape from the cavity. In one embodiment, the at least one cavity is filled to an extent of not more than 90%, preferably 80%, more preferably not more than 70%. In the case of multiple cavities, the cavities may be filled with equal amounts, or different amounts.

In one embodiment, the stoichiometric ratio of AX to $BX_2$ or BX and $B'X_3$ is in the region of 1:1. The stoichiometric ratio between AX and $BX_2$ or BX and $B'X_3$ is adjusted according to the envisaged emission wavelength of the conversion element. For instance, for red/orange emission of the converter, a stoichiometric ratio for an $ABX_3$ structure between CsBr and $PbI_2$, for example, of about 0.9:1.1 is chosen.

In one embodiment, the stoichiometric ratio of AX to BX and $B'X_3$ is in the region of 1:0.5:0.5. The stoichiometric ratio between AX and $BX_2$ or BX and $B'X_3$ is adjusted according to the envisaged emission wavelength of the conversion element. The combination of CsBr, AgBr and $BiBr_3$ in a stoichiometric ratio of 1:0.5:0.5 results, for example, in a red-luminescent $Cs_2AgBiBr_6$ structure.

In a further embodiment, the introducing of a precursor of the at least one conversion element comprises the step of:
introducing at least one additive into the at least one cavity, where the additive is selected from the group consisting of 2-benzylethylamine, 2-tert-butylethylamine and mixtures thereof.

The additive is chosen here so as to result in optimal adjustment of the crystal size of the $ABX_3$ or $A_2BB'X_6$ structure. Preference is given here to crystal sizes of about 200 nm to about 5 μm.

The additives are more preferably 2-benzylethylamine and 2-tert-butylethylamine. Depending on their state of matter, the additives may be introduced in liquid form or in gaseous form.

Preference is given to introducing an amount of an additive such that the cavity is filled in such a way that no additive can escape from the cavity.

In a further embodiment, nanostructuring of the $ABX_3$ or $A_2BB'X_6$ structure can be achieved by applying a shaping matrix after deposition of the two precursors. For this purpose, prior to lifting of the shaping matrix, the structure is exposed to gaseous solvent and, after lifting of the matrix, the nanostructured $ABX_3$ or $A_2BB'X_6$ structure can be generated by heating. For example, deposited CsBr and $PbBr_2$ can be structured by means of nanostructured polydimethylsiloxane (PDMS) matrix and exposed to $CH_3NH_2$ gas.

In a further embodiment, the introducing of the precursor of the at least one conversion element comprises the step of:

heating to a temperature in the range between 50° C. and 200° C., preferably 100° C. to 190° C., more preferably 150° C. to 180° C.

The heating evaporates the solvent, and the $ABX_3$ or $A_2BB'X_6$ structure of the conversion element is formed from the precursor. In general, the $ABX_3$ or $A_2BB'X_6$ structure is formed by crystallization. It is thus possible to form a sufficient number of small crystals, polycrystalline structures or else single crystals.

The temperature here is chosen so as to result in optimal adjustment of the crystal size of the $ABX_3$ or $A_2BB'X_6$ structure. Preference is given here to crystal sizes of about 200 nm to about 5 μm.

The heating to a particular temperature can be performed for a duration of 30 seconds to 10 minutes, preferably 2 minutes to 8 minutes, more preferably 4 minutes to 6 minutes.

The duration of heating may be dependent on factors including the type of solvent, the amount of solvent and/or the heating temperature.

The introducing of the precursor of the at least one conversion element may also comprise the step of:
introducing a suspension into the at least one cavity, where the suspension comprises at least one nanoparticle of the perovskite-based $ABX_3$ structure.

This step is especially effected in an alternative embodiment to the "in situ" method for preparing a perovskite-based $ABX_3$ or $A_2BB'X_6$ structure.

For medium- to high-power applications, perovskite-based $ABX_3$ or $A_2BB'X_6$ structures prepared especially by the "in situ" method described are used as converter. For low-power applications, it is especially possible to use solution-processible perovskite nanocrystals.

What is meant by a suspension in the context of the disclosure is a heterogeneous mixture of matter in which nanoparticles of the perovskite-based $ABX_3$ structure are present in a solvent, preferably an organic solvent. Examples of useful solvents include toluene, aliphatic hydrocarbons such as hexane, octane.

Preference is given to introducing an amount of a suspension such that the cavity is filled in such a way that no suspension can escape from the cavity. In one embodiment, the at least one cavity is filled to an extent of not more than 90%, preferably not more than 80%, more preferably not more than 70%. In the case of multiple cavities, the cavities may be filled with equal amounts, or different amounts.

The nanoparticles generally have a size between about 2 nm and about 20 nm, preferably between about 2 nm and about 10 nm.

In one embodiment, nanoparticles of perovskite-based $ABX_3$ structures are selected from groups 1 (K, Rb, Cs) for A, 14 (Ge, Sn, Pb) for B, 17 (Cl, Br, I) for X, and small organic molecules such as methylammonium or formamidinium for A. Illustrative perovskite-based $ABX_3$ structures of the nanoparticles are: $(K_{0.2}Cs_{0.8})PbBr_3$, $CsPbCl_3$, $CsPbBr_3$ $CsPbI_3$, $CsSnCl_3$, $CsSnBr_3$ $CsSnI_3$, $Cs_2BiAgCl_6$, $Cs_2BiAgBr_6$ or $Cs_2BiAgI_6$.

In one embodiment, in the context of the disclosure, in the perovskite-based $ABX_3$ structure of the nanoparticles, in general, the variable A represents at least one cation selected from the group consisting of methylammonium, formamidinium, $K^+$, $Rb^+$ and $Cs^+$, X represents an anion selected from the group consisting of $F^-$, $Cl^-$, $Br^-$ and $I^-$, and B represents at least one cation selected from the group consisting of $Pb^{2+}$ and $Sn^{2+}$.

The nanoparticles of the perovskite-based $ABX_3$ structure may be produced by standard methods as known in the prior art.

The formation of the conversion element from the suspension comprising at least one nanoparticle of the perovskite-based $ABX_3$ structure can be performed analogously to the above-described in situ method, i.e. by heating to a particular temperature within a particular time. In general, merely the solvent is evaporated here by heating. It is possible here, depending on the solvent, to use lower temperatures than in the in situ method. For example, conceivable temperatures here are in the range from 6° C. to 100° C.

The crystal size of the perovskites is defined by the synthetically produced nanoparticles and is usually between 2 nm and 25 nm. In this way, converter layers having a lateral extent of up to 0.5 μm are achievable. Such converter layers may additionally be methoded from solution and hence generally do not require complex pick & place methods.

In a further embodiment, the method for producing an optoelectronic semiconductor component further comprises the step of:
coating the at least one conversion element.

Perovskite-based materials may have instability to temperature and water, and to light to some degree. It is therefore particularly advantageously possible to embed and/or coat these materials in a matrix.

A matrix may be selected here from the group consisting, for example, of $AlO_x$ or $SiO_x$.

The matrix may be applied by means of atomic layer deposition (ALD).

The coating of the at least one conversion element may be selected from the group consisting of, for example, $AlO_x$ or $SiO_x$.

The coating of the at least one conversion element can be effected, for example, by means of ALD.

In an alternative embodiment, the coating can also be applied to the precursors of the at least one conversion element. This is especially possible in the case of use of nanoparticle suspensions as a precursor of conversion elements. Under some circumstances, these could be protected from environmental influences/premature aging by core-shell architectures (which are applied prior to deposition). These core-shell nanoparticles are synthesized by standard methods as known in the prior art.

The emission spectrum of perovskites can be adjusted by a simple method and extremely accurately between about 450 nm and 850 nm via changes in the elemental composition and/or quantum condinement effects. In combination with the potential for miniaturization mentioned, i.e. the adjustment of the crystal size of the perovskites to between about 200 nm to about 5 μm, it is thus possible to quantitatively adjust the color impression of a white light source by equipping, for example, individually actuatable μLED chips with different green light- and red light-emitting perovskites.

In one embodiment, the optoelectronic semiconductor chip comprises at least two cavities, preferably at least three cavities.

If multiple cavities are present, these may have an equal or different base area. In a preferred embodiment, they have the same base area. Conceivable base areas here are in the range from 1 μm² to 900 μm² per cavity, preference being given to base areas in the range from 1 μm² to 100 μm² per cavity, and particular preference being given to base areas in the range from 4 μm² to 25 μm² per cavity.

In one embodiment, a cavity has a volume of about 25 µm³. If multiple cavities are present, these may have an equal or different volume. In a preferred embodiment, they have the same volume. Conceivable volumes here are in the range from 1 µm³ to 900 µm³ per cavity, preference being given to volumes in the range from 1 µm³ to 100 µm³ per cavity, and particular preference being given to volumes in the range from 4 µm³ to 25 µm³ per cavity.

In one embodiment in which multiple cavities are present (for example two or three cavities), the introducing of a precursor of the at least one conversion element comprises the steps of:
  introducing a solution of AX into the first cavity,
  introducing a solution of $BX_2$ or BX and $B'X_3$ into the first cavity,
  introducing a solution of AX into the second cavity,
  introducing a solution of $BX_2$ or BX and $B'X_3$ into the second cavity,
  where A is at least one cation selected from the group consisting of methylammonium, formamidinium, $K^+$, $Rb^+$ and $Cs^+$; X is selected from the group consisting of $F^-$, $Cl^-$, $Br^-$ and $I^-$; B is a cation selected from the group consisting of $Pb^{2+}$, $Sn^{2+}$ and $Ge^{2+}$.

If the step of introducing a solution of BX and $B'X_3$ is included, B and B' may, for example, respectively be $Ag^+$ and $Bi^{3+}$ or $Bi^+$ and $Bi^{3+}$.

In this embodiment, the solutions of AX, $BX_2$ or BX and $B'X_3$ should preferably be chosen such that the solutions of AX for the first cavity and the second cavity are each different and/or the solutions of $BX_2$ or BX and $B'X_3$ for the first cavity and the second cavity are each different.

If, in such an embodiment, for example, three or more cavities are present, preferably three cavities, preferably no solutions of AX and $BX_2$ or BX and $B'X_3$ are introduced into at least one cavity.

In a further embodiment, the solutions AX, $BX_2$ or BX and $B'X_3$ for the first cavity are chosen such that they form a precursor of a conversion element that can convert blue light to red light. Examples of these are $CsPbI_3$ or mixtures of $CsPbI_3$ and $CsPbBr_3$. The solutions AX, $BX_2$ and or BX and $B'X_3$ for the second cavity may be chosen such that they form a precursor of a conversion element that can convert blue light to green light. Examples of these are $CsPbBr_3$ or mixtures of $CsPbBr_3$ and $CsPbCl_3$.

Byway of example, it is thus possible to produce an optoelectronic semiconductor component (for example an LED, especially comprising at least one µLED chip) that emits white light.

The embodiments described above are also applicable to embodiments with any number of n cavities.

In one embodiment, it is possible to introduce n identical precursors of conversion elements into n cavities, such that each cavity may have the same conversion element.

In one embodiment, it is possible to introduce n different precursors of conversion elements into n cavities, such that the n cavities may have different conversion elements.

In one embodiment, it is possible to introduce n−1 identical or different precursors of conversion elements into n cavities, such that n−1 cavities may have identical or different conversion elements.

In one embodiment, it is possible to introduce n-x identical or different precursors of conversion elements into n cavities, such that n-x cavities may have identical or different conversion elements, where x<n.

The introducing of the precursor of the at least one conversion element may also comprise the step of:
  introducing a first suspension into the first cavity, where the suspension comprises at least one nanoparticle of the perovskite-based $ABX_3$ structure;
  introducing a second suspension into the second cavity, where the suspension comprises at least one nanoparticle of the perovskite-based $ABX_3$ structure,
  where the nanoparticles of the first and second suspensions are preferably different.

If, in such an embodiment, for example, three or more cavities are present, preference being given to three cavities, a first suspension is preferably introduced into at least one first cavity and a second suspension a second cavity.

If, in such an embodiment, for example, three or more cavities are present, preference being given to three cavities, preferably no suspension comprising nanoparticles of the perovskite-based $ABX_3$ structure is introduced into at least one cavity.

The introducing of the precursors of the conversion elements and the further steps of the method for producing a conversion element can be performed as described above.

Embodiments further provide an optoelectronic semiconductor component comprising:
  at least one optoelectronic semiconductor chip comprising,
  at least one light-emitting layer,
  at least one cavity, and
  at least one conversion element,
  wherein the at least one conversion element comprises a perovskite-based $ABX_3$ or $A_2BB'X_6$ structure.

What is meant by an optoelectronic semiconductor component in the context of the disclosure is, for example, a LED (light-emitting diode), especially comprising at least one µLED chip.

What is meant by an optoelectronic semiconductor chip in the context of the disclosure is an electrically contactable element that can be handled separately. A semiconductor chip is especially the result of individualization from a wafer composite. According to embodiments, the optoelectronic semiconductor chip comprises at least one light-emitting layer. This may comprise gallium nitride, for example.

The optoelectronic semiconductor chip further comprises at least one cavity as already described above.

The at least one conversion element has a perovskite-based $ABX_3$ or $A_2BB'X_6$ structure, as described above. Illustrative perovskite-based $ABX_3$ or $A_2BB'X_6$ structures are: $(K_{0.2}Cs_{0.8})PbBr_3$, $CsPbCl_3$, $CsPbBr_3$ $CsPbI_3$, $CsSnCl_3$, $CsSnBr_3$ $CsSnI_3$, $Cs_2BiAgCl_6$, $Cs_2BiAgBr_6$ or $Cs_2BiAgI_6$.

In a further embodiment, the optoelectronic semiconductor component comprises at least one coating. The coating may be selected from the group consisting of $AlO_x$ and $SiO_x$.

Alternatively, the at least one conversion element may be embedded in a matrix.

A matrix may be selected here from the group consisting of $AlO_x$ and $SiO_x$.

The matrix may be applied by means of atomic layer deposition (ALD).

The at least one conversion element can be coated, for example, by means of ALD.

In a further embodiment, the optoelectronic semiconductor component comprises at least two cavities, preferably at least three cavities. According to the size of the optoelectronic semiconductor component, any number of cavities may be present.

The sizes of the cavities are conceivable within the range as described above.

Embodiments further provide an optoelectronic semiconductor component which is produced by a method as described herein.

Yet other embodiments provide the use of an optoelectronic semiconductor component described herein in an optoelectronic display device. Conceivable optoelectronic display devices are displays, projectors, flat screens (in the form of TVs or mobile devices), user interfaces, devices for displaying visual information etc.

In one embodiment, a non-specific nanostructured lattice structure which is reflective and/or absorptive with respect to the light emitted is applied to a blue emitter. The green light- and red light-emitting perovskite converters are introduced into the resultant wells or cavities from solution. Within a series of three adjacent wells, one well containing no converter material, one well is filled with green light-emitting converter and one well with red light-emitting converter. Bromide- and iodide-based precursor materials are used for green light- and red light-emitting converters respectively.

BRIEF DESCRIPTION OF THE DRAWINGS

Further advantageous embodiments and developments of the invention will be apparent from the working examples described hereinafter in conjunction with the figures.

DETAILED DESCRIPTION OF ILLUSTRATIVE EMBODIMENTS

Figure 1:
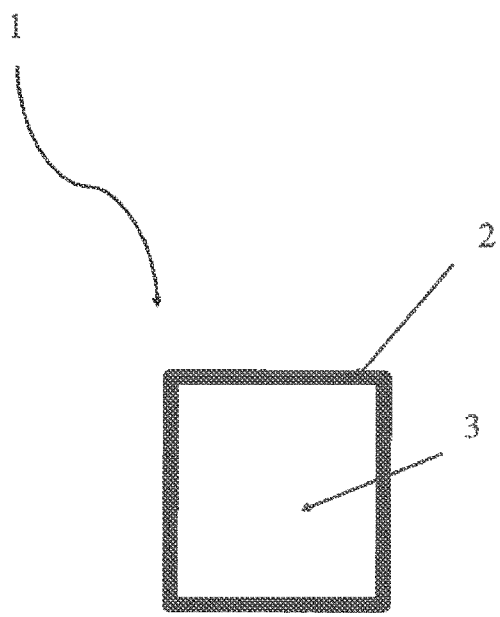
FIG. 1 shows a top view of an optoelectronic semiconductor chip having one cavity.

FIG. 1 shows an optoelectronic semiconductor chip (1) having a dividing wall (2) and one cavity (3). The dividing wall may have a thickness of 2 μm, a length of 5 μm and a height of 1 μm. The cavity in such an embodiment has a base area of 25 μm². The cavity may have a conversion element (e.g. $CsPbBr_3$).

Figure 2:
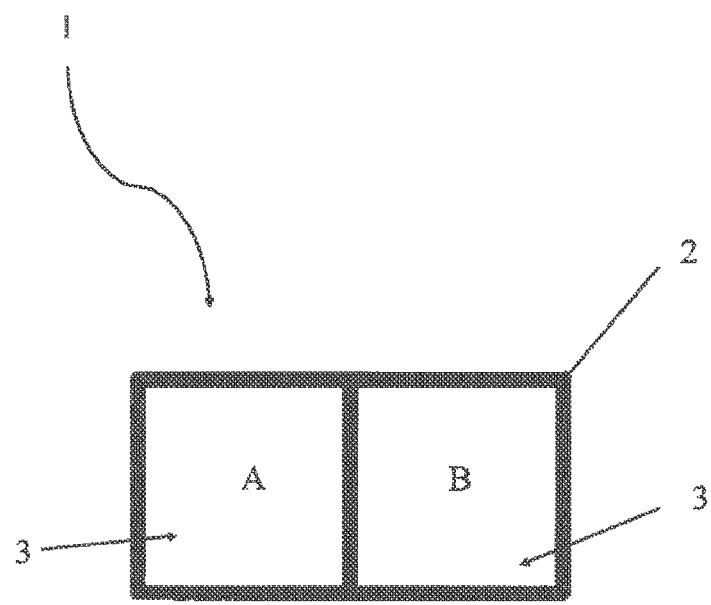
FIG. 2 shows a top view of an optoelectronic semiconductor chip having two cavities.

FIG. 2 shows an optoelectronic semiconductor chip (1) having a dividing wall (2) and two cavities (3) A and B. The dividing wall may have a thickness of 2 m, a length of 5 μm and a height of 1 μm. The dividing wall between the cavities (3) A and B may have the same thickness, or a different thickness (e.g. 5 μm). The cavities in such an embodiment each have a base area of 25 μm². The cavities (3) A and B may have the same size, or a different size. The cavities (3) may each have a conversion element (e.g. $CsPbBr_3$). In one embodiment, one cavity (e.g. cavity B) may also have a different conversion element (e.g. $CsPbI_3$).

The following illustrative executions are conceivable:

| No. | Cavity A | Cavity B |
|---|---|---|
| 1 | In-situ perovskite $CsPb(Br, I)_3$ in 2-phenoxyethylamine matrix encapsulated with $AlO_x$ | In-situ perovskite $CsPbBr_3$ in 2-phenoxyethylamine matrix encapsulated with $AlO_x$ |
| 2 | In-situ perovskite $CsPb(Br, I)_3$ in 2-phenoxyethylamine matrix encapsulated with $AlO_x$ | No conversion element |
| 3 | In-situ perovskite $CsPbBr_3$ in 2-phenoxyethylamine matrix encapsulated with $AlO_x$ | No conversion element |
| 4 | Perovskite nanoparticles based on $CsPb(Br, I)_3$ encapsulated with $AlO_x$ | Perovskite nanoparticles based on $CsPbBr_3$ encapsulated with $AlO_x$ |
| 5 | Perovskite nanoparticles based on $CsPb(Br, I)_3$ encapsulated with $AlO_x$ | No conversion element |
| 6 | Perovskite nanoparticles based on $CsPbBr_3$ encapsulated with $AlO_x$ | No conversion element |

Figure 3:
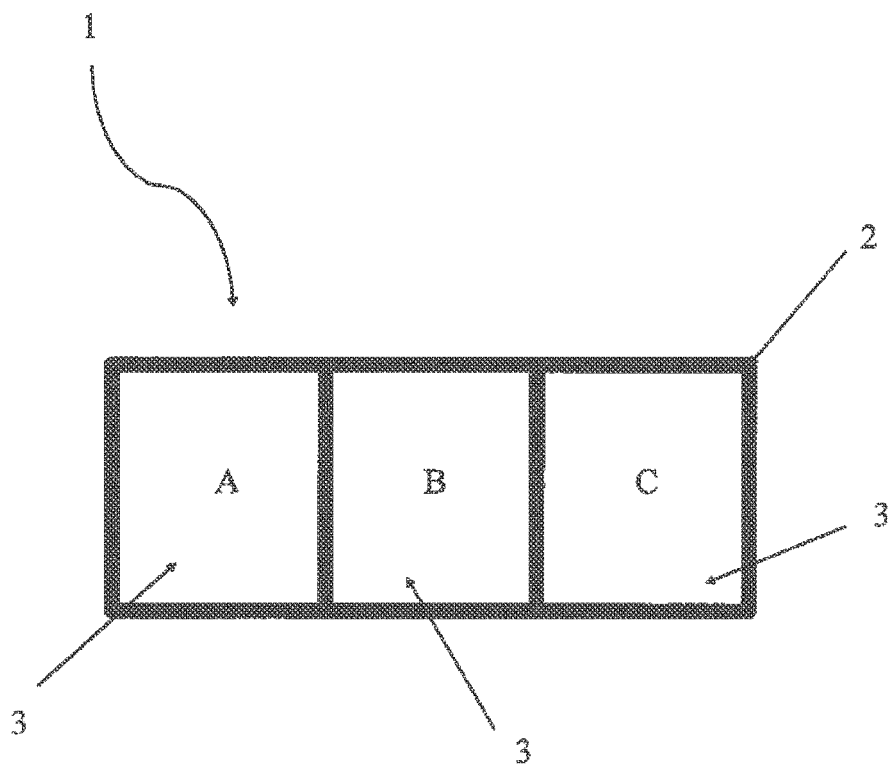
FIG. 3 shows a top view of an optoelectronic semiconductor chip having three cavities.

FIG. 3 shows an optoelectronic semiconductor chip (1) having a dividing wall (2) and three cavities (3) A, B and C. The dividing wall may have a thickness of 2 m, a length of 5 μm and a height of 1 μm. The dividing walls between the cavities (3) A, B and C may have the same thicknesses, or different thicknesses (e.g. 5 μm). The cavities (3) in such an embodiment each have a base area of 25 μm². The cavities (3) A, B and C may have the same size, or a different size. The cavities (3) may each have a precursor of a conversion element (e.g. CsBr) or each have a conversion element (e.g. $CsPbBr_3$).

In one embodiment, one cavity has a perovskite-based $ABX_3$ or $A_2BB'X_6$ structure that converts blue light to red light (e.g. $CsPb(Br,I)_3$) and one cavity has a perovskite-based $ABX_3$ or $A_2BB'X_6$ structure that converts blue light to green light (e.g. $CsPbBr_3$) and one cavity has no conversion element.

The following illustrative executions are conceivable:

| No. | Cavity A | Cavity B | Cavity C |
|---|---|---|---|
| 1 | In-situ perovskite $CsPb(Br, I)_3$ in 2-phenoxyethylamine matrix encapsulated with $AlO_x$ | In-situ perovskite $CsPbBr_3$ in 2-phenoxyethylamine matrix encapsulated with $AlO_x$ | No conversion element |
| 2 | Perovskite nanoparticles based on $CsPb(Br, I)_3$ encapsulated with $AlO_x$ | Perovskite nanoparticles based on $CsPbBr_3$ encapsulated with $AlO_x$ | No conversion element |

Figure 4:
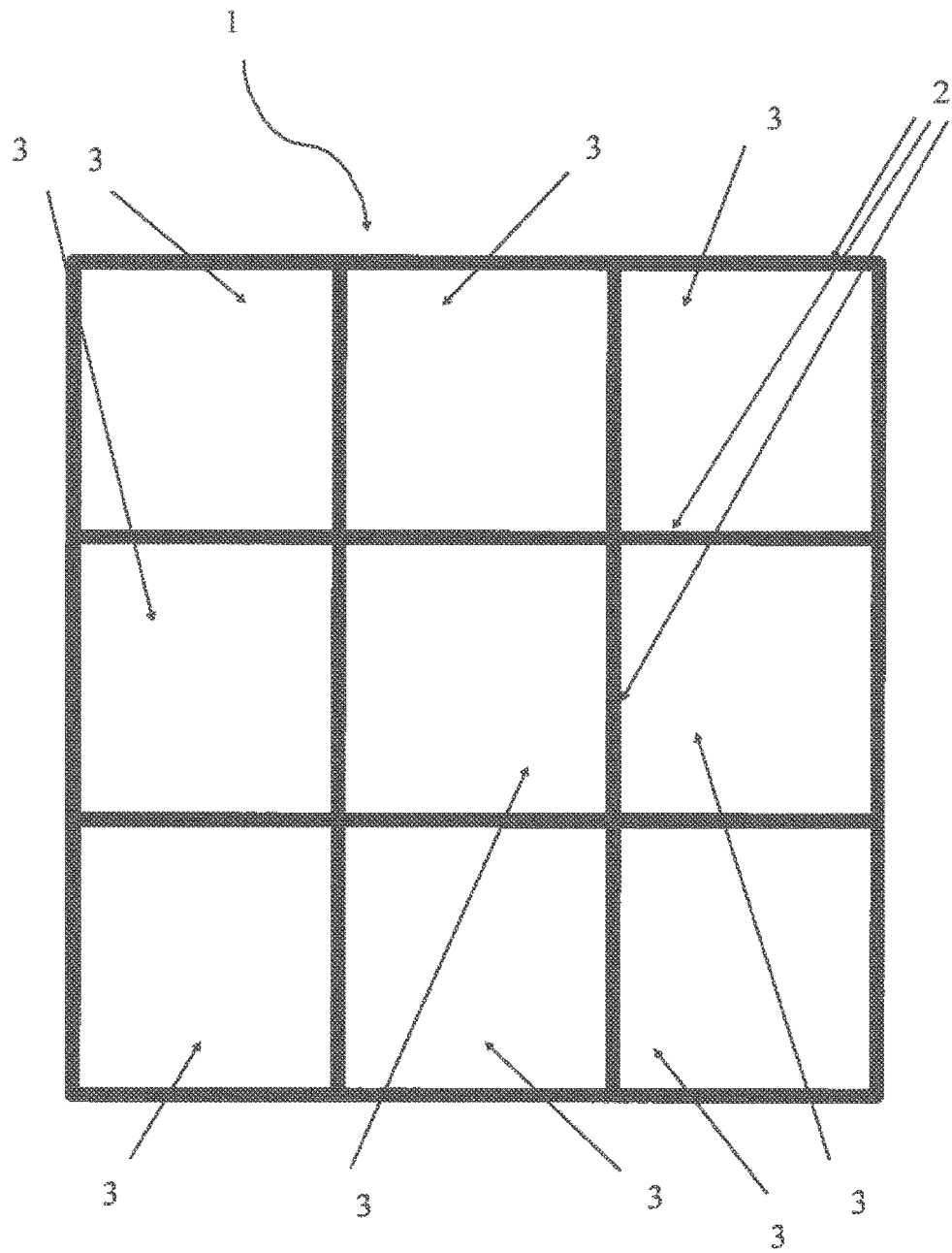
FIG. 4 shows atop view of an optoelectronic semiconductor chip having four cavities.

FIG. 4 shows an optoelectronic semiconductor chip (1) having a dividing wall (2) and nine cavities (3). The dividing wall may have a thickness of 2 μm, a length of 5 μm and a height of 1 μm. The dividing walls between the cavities (3) may have the same thicknesses, or different thicknesses (e.g. 5 μm). The cavities (3) in such an embodiment each have a base area of 25 μm². The cavities (3) may have the same size, or a different size. The cavities (3) may each have a precursor of a conversion element (e.g. CsBr) or each have a conversion element (e.g. $CsPbBr_3$).

In one embodiment, at least one cavity has a perovskite-based $ABX_3$ or $A_2BB'X_6$ structure that converts blue light to red light (e.g. $CsPbI_3$) and at least one cavity has a perovskite-based $ABX_3$ or $A_2BB'X_6$ structure that converts blue light to green light (e.g. $CsPbBr_3$) and at least one cavity has no conversion element.

Figure 5:
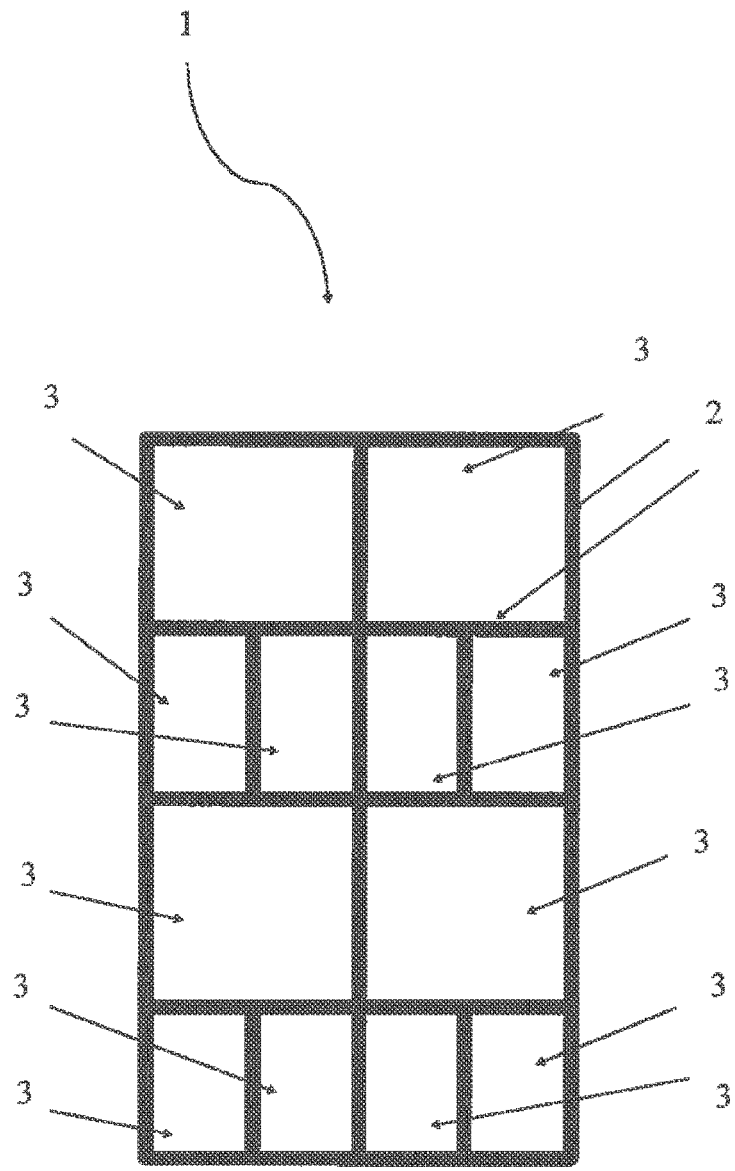
FIG. 5 shows a top view of an optoelectronic semiconductor chip having twelve cavities of different size.

FIG. 5 shows an optoelectronic semiconductor chip (1) having a dividing wall (2) and twelve cavities (3). The dividing wall may have a thickness of 2 m, a length of 5 μm and a height of 1 μm. The dividing walls between the cavities (3) may have the same thicknesses, or different thicknesses (e.g. 5 μm). The cavities (3) in such an embodiment each have a base area of between 10 and 25 μm². FIG. 5 shows that the cavities (3) may have a different size. The cavities (3) may each have a precursor of a conversion element (e.g. CsBr) or each have a conversion element (e.g. $CsPbBr_3$).

In one embodiment, at least one cavity has a perovskite-based $ABX_3$ or $A_2BB'X_6$ structure that converts blue light to red light (e.g. $CsPbI_3$) and at least one cavity has a perovskite-based $ABX_3$ or $A_2BB'X_6$ structure that converts blue light to green light (e.g. $CsPbBr_3$) and at least one cavity has no conversion element.

Figure 6:
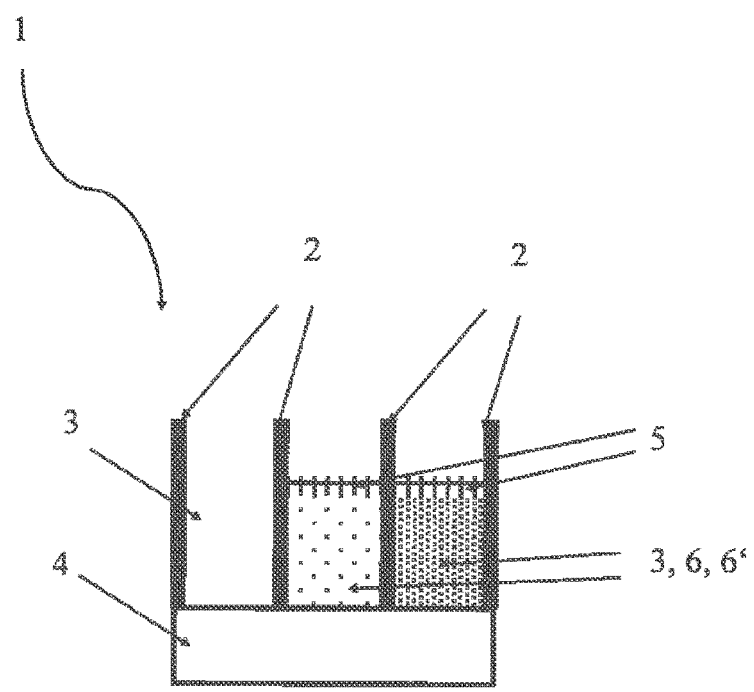
FIG. 6 shows a side view of an optoelectronic semiconductor chip having three cavities.

FIG. 6 shows a side view of an optoelectronic semiconductor chip (1) having four dividing walls (2) and three cavities (3). The dividing walls may have a thickness of 2 μm, a length of 5 μm and a height of 1 μm. The dividing walls between the cavities (3) may have the same thicknesses, or different thicknesses (e.g. 5 μm). Additionally shown is a light-emitting layer (4) which may be indium-doped gallium nitride. The cavities (3) may each have a conversion element (6, 6') (e.g. $CsPbBr_3$). In the embodiment shown, the conversion elements (6, 6') have been coated with a layer (5) (e.g. $AlO_x$).

In one embodiment, a cavity (3) has no conversion element, such that the blue light from the light-emitting layer can be emitted to the outside. One cavity (3) may have a perovskite-based $ABX_3$ or $A_2BB'X_6$ structure that converts blue light to red light (e.g. $CsPbI_3$) and one cavity (3) may have a perovskite-based $ABX_3$ or $A_2BB'X_6$ structure that converts blue light to green light (e.g. $CsPbCl_3$). It is possible to adjust the light color of the light thus generated (especially white light) via the type of perovskite-based structure, the amount of the perovskite-based structure and the size of the respective cavities.

Figure 7:
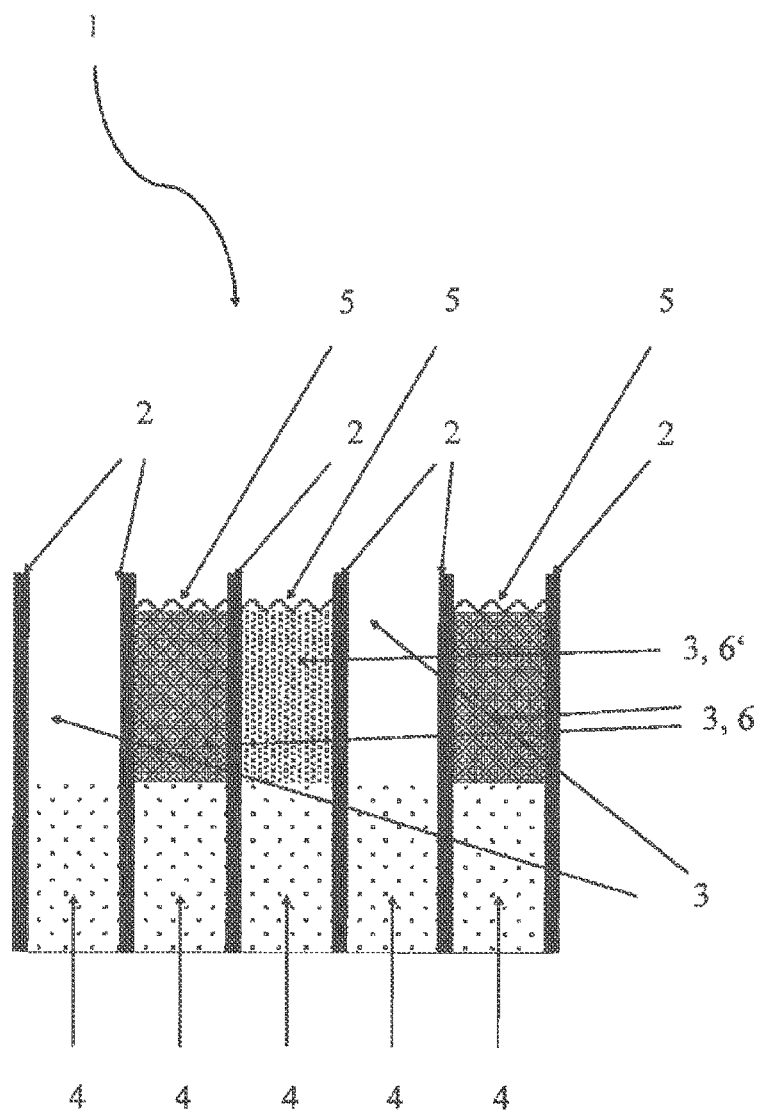
FIG. 7 shows a side view of an optoelectronic semiconductor chip having five cavities.

FIG. 7 shows a side view of an optoelectronic semiconductor chip (1) having six dividing walls (2) and five cavities (3). The dividing walls (2) may have a thickness of 2 μm, a length of 5 μm and a width of 1 μm. The dividing walls (2) between the cavities (3) may have the same thicknesses, or different thicknesses (e.g. 5 μm). Additionally shown is a light-emitting layer (4) which may be indium-doped gallium nitride. The light-emitting layer in this embodiment is divided by the respective dividing walls (2) into individual compartments that may be separately actuatable. The cavities (3) may each have a conversion element (6, 6') (e.g. $CsPbBr_3$). The conversion elements (6, 6') may have been coated with a layer (5) (e.g. $AlO_x$).

The effect of the separate actuatability of the light-emitting layers (4) and the presence of the dividing walls (2) is that an actuated light-emitting layer (4) does not emit light across an adjacent light-emitting layer (4) that is not being actuated. In this way, crosstalk of adjacent light-emitting layers (4) is noticeably reduced by the dividing walls (2).

In one embodiment, two cavities (3) have no conversion element, such that the blue light from the light-emitting layer can be emitted to the outside. One cavity (3) may have a perovskite-based $ABX_3$ or $A_2BB'X_6$ structure that converts blue light to red light (e.g. $CsPbI_3$) and two cavities (3) may have a perovskite-based $ABX_3$ or $A_2BB'X_6$ structure that converts blue light to green light (e.g. $CsPbBr_3$). In a further embodiment, one cavity (3) may have a perovskite-based $ABX_3$ or $A_2BB'X_6$ structure that converts blue light to green light (e.g. $CsPbBr_3$) and two cavities (3) may have a perovskite-based $ABX_3$ or $A_2BB'X_6$ structure that converts blue light to red light (e.g. $CsPbI_3$).

It is possible to adjust the light color of the light thus generated (especially white light) via the type of perovskite-based structure, the amount of the perovskite-based structure and the size of the respective cavities.

Examples of preparation of perovskite-based $ABX_3$ or $A_2BB'X_6$ structures: "In-situ generation of perovskite-based $ABX_3$ or $A_2BB'X_6$ structures":

The precursor AX (e.g. cesium halide (CsCl, CsBr or CsI), methylammonium halide (MA Cl, MA Br or MA I) or formamidinium halide (FA Cl, FA Br or FA I; respective purity level 99.999%) are used without further purification. The precursor $BX_2$ (e.g. $PbCl_2$, $PbBr_2$ or $PbI_2$, respective purity level 98%), prior to further use, is dried in a vacuum oven at 150° C. for at least 12 h. Equimolar amounts of the precursors AX and $BX_2$ are dissolved in polar aprotic solvent (e.g. dimethyl sulfoxide (DMSO) or dimethylformamide (DMF)) with constant stirring at 50° C. and under air (air humidity about 45%) (final total concentration: 0.45 M). After cooling to room temperature, the solution is titrated with methyl cyanide or methanol. Saturation is apparent from a permanent white precipitate. The saturated solution is sealed and stirred at 50° C. for 24 h. Thereafter, as well as other precipitated substances, a highly fluorescent precipitate is apparent. The saturated solution can be stored in the dark for several months. Prior to deposition, the saturated precursor solution is filtered (PTFE, pore size 0.2 μm).

"Synthesis of Colloidal Perovskite Nanoparticles":

The synthesis of $CsPbX_3$ (X=Cl, Br or I) nanoparticles follows standard hot injection methods. For this purpose, cesium oleate is first prepared by drying $Cs_2CO_3$ (0.814 g) together with octadecene (ODE, 40 mL, 90%) and oleic acid (2.5 mL, 90%) at 120° C. under reduced pressure for 1 h. Subsequently, the combination of materials is heated to 150° C. under protective gas in order to form cesium oleate. In parallel, ODE is heated to 100° C. under protective gas. In a further reaction vessel, ODE (5 mL) and $PbX_2$ (0.188 mmol, i.e. $PbI_2$ (0.087 g, 99.999%), $PbBr_2$ (0.069 g, 98%) or $PbCl_2$ (0.052 g, 99.999%)) are combined and stirred at 120° C. for 1 h. Dried oleylamine (0.5 mL, OLA, 80-90%) and dried oleic acid (0.5 mL) are injected into the latter reaction vessel at 120° C. under protective gas atmosphere. Once the lead salt has completely dissolved, the temperature of the solution is increased to 140-200° C. Relatively low temperatures are chosen for small nanoparticles, and higher temperatures for larger nanoparticles. The cesium oleate solution prepared (0.4 mL, 0.125 M in ODE) is injected rapidly into the lead salt solution. 5 seconds later, the reaction vessel is cooled by means of an ice bath. In the case of $CsPbCl_3$ particles, a higher reaction temperature of at least 150° C. and an additional 1 mL of trioctylphosphine (TOP, 97%) are required to solubilize $PbCl_2$. In order to purify the nanoparticles formed, the cooled reaction solution is centrifuged in order to remove other reactants and aggregated particles. For relatively small nanoparticles that are synthesized at temperatures of <160° C., the mixture is centrifuged at 0° C., and tert-BuOH (tBuOH, 99%) is additionally added. After centrifugation, the supernatant is discarded, and the nanoparticles synthesized are taken up in hexane or toluene.

A standard procedure for synthesis of hybrid nanoparticles (i.e. $APbX_3$, A=organic cation, X=halide) is what is called the ligand-assisted reprecipitation (LARP) method (see, for example, Sichert et al. NanoLett 2015, 15, 6521). For this purpose, polar aprotic solvent capable of dissolving the inorganic lead-containing and organic ammonium-containing salts (i.e. $PbX_2$ and MA X) (e.g. DMSO or DMF) is employed. This solution containing both salts is injected into a nonpolar ("poor") solvent containing coordinating ligands such as oleic acid or oleylamine. The latter stabilize the forming nanoparticles in solution. The nanoparticles are purified as described above.

After the method of depositing the precursors of the conversion elements, in the case of perovskite generated in situ, the solid-state material is formed at a maximum of 180° C. (within a few minutes).

By virtue of the embodiments, it is possible to produce microstructured white light emitters having a widely adjustable color temperature, and it is thus ideally possible to avoid complex handling of individual chips.

In addition, it is possible by virtue of embodiments, building on individually controllable blue µLED matrices having a preferred edge length of up to 1 µm that have already been positioned, it is possible to achieve RGB-capable µLED arrangements having minimum pitch size (in some cases pitch edge length about 5 µm). Owing to the small structurability of the perovskite converter materials (grain sizes of a few nm in some cases), the size limit of the individual pixels here is considered not to be their RGB capability, but rather the initial size of the blue light-emitting, InGaN-based semiconductor chips and the precision of the pick & place method. In order to facilitate defect management, a 3×3 chip arrangement within the pitch is recommended.

The invention is not limited to the working examples by the description with reference thereto. Instead, the invention encompasses any new feature and any combination of features, which especially includes any combination of features in the patent claims, even if this feature or this combination itself is not specified explicitly in the patent claims or working examples.

The invention claimed is:

1. A method for producing an optoelectronic semiconductor component, the method comprising:
   providing an optoelectronic semiconductor chip comprising at least one light-emitting layer and at least one cavity, wherein the at least one cavity is defined by a base surface extending laterally over a part of a light emission surface of the light emitting layer, and wherein the at least one cavity comprises the light emitting layer as a base; and
   introducing at least one precursor of a conversion element in the at least one cavity,
   wherein at least one conversion element comprises a perovskite-based ABX3 or A2BB'X6 structure,
   wherein, in the perovskite-based ABX3 or A2BB'X6 structure, A is at least one cation selected from the group consisting of methylammonium, formamidinium, K+, Rb+ and Cs+, wherein X is selected from the group consisting of F—, Cl—, Br— and I—, wherein, in case of the ABX3 structure, B is a cation selected from the group consisting of Pb2+, Sn2+ and Ge2+, wherein, in case of the A2BB'X6 structure, B is selected from the group consisting of Bi+ and Ag+, and wherein B' is Bi+.

2. The method according to claim 1, wherein introducing the precursor of the at least one conversion element comprises:
   introducing a solution of AX into the at least one cavity; and
   introducing a solution of BX2 in case of the ABX3 structure or BX and B'X3 in case of the A2BB'X6 structure into the at least one cavity.

3. The method according to claim 2, wherein introducing the precursor of the at least one conversion element further comprises heating the solutions to a temperature in a range between 50° C. and 200° C., inclusive.

4. The method according to claim 3, wherein heating is performed for a duration of 30 seconds to 10 minutes, inclusive.

5. The method according to claim 1, wherein introducing the precursor of the at least one conversion element comprises introducing a suspension into the at least one cavity, and wherein the suspension comprises at least one nanoparticle of the perovskite-based ABX3 structure.

6. The method according to claim 1, further comprising coating the at least one conversion element.

7. The method according to claim 1, wherein the optoelectronic semiconductor chip comprises at least two cavities.

8. The optoelectronic semiconductor component produced according to the method of claim 1.

9. An optoelectronic semiconductor component comprising:
   at least one optoelectronic semiconductor chip comprising:
      at least one light-emitting layer;
      at least one cavity; and
      at least one conversion element,
      wherein the at least one cavity is defined by a base surface extending laterally over a part of a light emission surface of the light emitting layer,
      wherein the at least one cavity comprises the light emitting layer as a base,
      wherein the at least one conversion element comprises a perovskite-based ABX3 or A2BB'X6 structure,
      wherein the at least one cavity has a volume in a range from 1 µm3 to 900 µm3, inclusive,
      wherein, in the perovskite-based ABX3 or A2BB'X6 structure, A is at least one cation selected from the group consisting of methylammonium, formamidinium, K+, Rb+ and Cs+, wherein X is selected from the group consisting of F—, Cl—, Br— and I—, wherein, in case of the ABX3 structure, B is a cation selected from the group consisting of Pb2+, Sn2+ and Ge2+, wherein, in case of the A2BB'X6 structure, B is selected from the group consisting of Bi+ and Ag+, and wherein B' is Bi+.

10. The optoelectronic semiconductor component according to claim 9, further comprising at least one coating.

11. The optoelectronic semiconductor component according to claim 9, wherein the at least one optoelectronic semiconductor chip comprises at least two cavities.

12. The optoelectronic semiconductor component according to claim 9, wherein the at least one cavity has a side length of 1 µm to 25 µm, inclusive.

13. A display device comprising:
   the optoelectronic semiconductor component of claim 9.

* * * * *